(12) United States Patent
Storm et al.

(10) Patent No.: US 9,673,375 B2
(45) Date of Patent: Jun. 6, 2017

(54) POWER GENERATOR WITH AN ELECTRICAL COMPONENT MADE FROM INERTIAL MASS AND CONTROL CIRCUIT THEREOF

(71) Applicant: Airbus Defence and Space GmbH, Ottobrunn (DE)

(72) Inventors: Stefan Storm, Unterschleissheim (DE); Rudolf Maier, Miesbach (DE)

(73) Assignee: AIRBUS DEFENCE AND SPACE GMBH, Ottobrunn (DE)

( * ) Notice: Subject to any disclaimer, the term of this patent is extended or adjusted under 35 U.S.C. 154(b) by 139 days.

(21) Appl. No.: 14/807,904

(22) Filed: Jul. 24, 2015

(65) Prior Publication Data

US 2016/0035964 A1 Feb. 4, 2016

(30) Foreign Application Priority Data

Jul. 29, 2014 (DE) .................. 10 2014 110 753

(51) Int. Cl.
| | |
|---|---|
| *H01L 41/09* | (2006.01) |
| *H01L 41/04* | (2006.01) |
| *B06B 1/00* | (2006.01) |
| *F16F 7/10* | (2006.01) |

(52) U.S. Cl.
CPC .......... *H01L 41/0973* (2013.01); *B06B 1/00* (2013.01); *F16F 7/1011* (2013.01); *F16F 7/1034* (2013.01); *H01L 41/042* (2013.01); *F16F 2224/0283* (2013.01)

(58) Field of Classification Search
USPC ................................ 310/311–371
See application file for complete search history.

(56) References Cited

U.S. PATENT DOCUMENTS

| | | | |
|---|---|---|---|
| 6,062,551 A | 5/2000 | Oku et al. | |
| 6,134,964 A | 10/2000 | Jaenker et al. | |
| 6,411,009 B2 | 6/2002 | Jaenker | |
| 2005/0280332 A1 | 12/2005 | Ollila | |
| 2005/0285477 A1 | 12/2005 | Ollila | |
| 2008/0031667 A1 | 2/2008 | Tsai et al. | |
| 2008/0315725 A1 | 12/2008 | Konstanzer et al. | |
| 2011/0260465 A1* | 10/2011 | Pedersen ................. | F03D 1/001 290/55 |
| 2013/0195653 A1* | 8/2013 | Hayashi .................. | F03D 11/00 416/1 |
| 2014/0265731 A1 | 9/2014 | Storm et al. | |

FOREIGN PATENT DOCUMENTS

| | | | |
|---|---|---|---|
| DE | 19621700 C2 | 12/1997 | |
| DE | 10321436 B4 | 12/2004 | |
| EP | 0907036 A2 | 4/1999 | |
| EP | 2733839 A1 | 5/2014 | |
| FR | 2692017 A1 * | 12/1993 | ............. F16F 15/00 |
| WO | WO 2007073820 A1 | 7/2007 | |
| WO | WO 2011153996 A2 | 12/2011 | |

* cited by examiner

*Primary Examiner* — Thomas Dougherty
(74) *Attorney, Agent, or Firm* — Leydig, Voit & Mayer, Ltd.

(57) ABSTRACT

A force generator for introducing vibrational forces into a structure for vibration control of the structure includes an inertial mass, at least one actuator for generating a vibratory movement of the inertial mass relative to the structure, and a drive circuit constructed from components for driving the at least one actuator. At least part of the inertial mass is formed by one component of the drive circuit.

18 Claims, 5 Drawing Sheets

POWER GENERATOR WITH AN ELECTRICAL COMPONENT MADE FROM INERTIAL MASS AND CONTROL CIRCUIT THEREOF

CROSS-REFERENCE TO PRIOR APPLICATION

Priority is claimed to German Patent Application No. DE 10 2014 110 753.5, filed on Jul. 29, 2014, the entire disclosure of which is hereby incorporated by reference herein.

FIELD

The invention relates to a drive circuit, in particular an amplifier circuit, for a force generator. Furthermore, the invention relates to a force generator for introducing vibrational forces into a structure for vibration control of the structure, having: an inertial mass, at least one actuator for generating a vibratory movement of the inertial mass relative to the structure, and an electronic drive circuit constructed from components for driving the at least one actuator.

BACKGROUND

In general, the invention relates to a force generator for generating a force to be applied to a structure with the aid of an inertial mass and a drive circuit for this purpose. The force generator serves in particular to control vibrations in structures. For example, targeted counter vibrations are to be introduced into a structure in order to reduce the overall level of vibrations in the structure. Such force generators are used, for example, in a device for vibration control. The invention is used in particular in vibration control in helicopters and aircraft.

Force generators serve to generate a desired force by means of a predetermined inertial mass. In the process, the force results from the inertia of the inertial mass which is moved in any way. In order to generate as great a force as possible, the inertial mass can, on the one hand, be moved at as fast an acceleration as possible or with a great displacement. Alternatively, or in addition to this, such a great force can also be generated by as great an inertial mass as possible.

Force generators are, for example, used for the targeted introduction of forces into vibrating structures such as aircraft, motor vehicles or machine components in order, for example, to counteract vibration levels and eliminate them. Force generators for vibration damping are also known as inertial mass actuators. They are attached, for example, as additional systems to existing machines or devices in order to reduce vibrations or to introduce process forces. Force generators or inertial mass actuators are constructed, for example, from a spring-inertial-mass system into which an actuator is integrated. Piezoelectric actuators are used, for example, in the process.

Examples of force generators for introducing vibrational forces of the type stated in the preamble of claim 1 are known from WO 2007/073820 A1 and US 2005/0280332 A1.

In WO 2007/073820 A1 in the process, an inertial mass is provided on a flexural arm, which is caused to vibrate flexurally by means of one or more piezoelectric actuators. For this purpose a drive in the form of an electronic drive circuit for driving the actuator or actuators is provided.

Examples of electronic drive circuits for driving piezoelectric actuators of force generators are described and shown in EP 0 907 036 A2, US 2005/0280332 A1, US 2005/0285477 A1, US 6 411 009 B2, US 2008/031667 A1 and EP 2 733 839 A1.

In piezoelectric force generators an amplifier is provided for constructing the electronic drive circuit.

In comparison with electrodynamic systems, known piezoelectric force generators are disadvantageous in that the weight of the required amplifier is higher due to the principle. The reason for this is, in particular, an inductor which is used in clocked amplifiers for smoothing the output voltage.

SUMMARY

A force generator for introducing vibrational forces into a structure for vibration control of the structure includes an inertial mass, at least one actuator for generating a vibratory movement of the inertial mass relative to the structure, and a drive circuit constructed from components for driving the at least one actuator. At least part of the inertial mass is formed by one component of the drive circuit.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
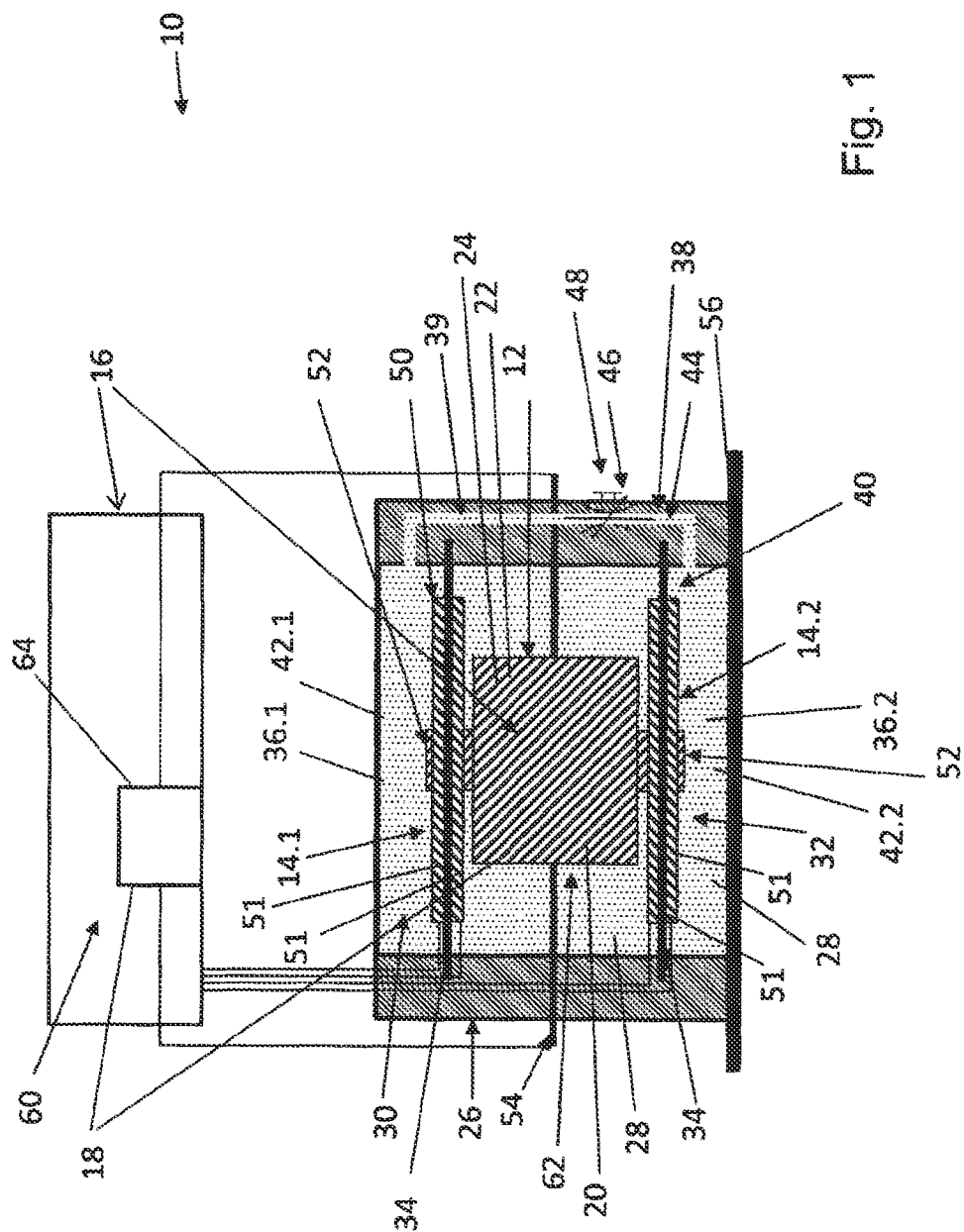
FIG. 1 is a schematic sectional view of a first embodiment of a force generator.

According to a first aspect, the invention provides a drive circuit for a force generator for introducing vibrational forces into a structure, at least one component of the drive circuit being constructed as a vibrating mass.

The at least one component constructed as a vibrating mass can, for example, constitute a vibrating mass or an inertial mass of a mechanical resonator or force generator alone or it can be combined with other vibrating masses to form a vibrating total mass which forms the vibrating total mass or the inertial mass of a resonator or force generator.

According to embodiments of the invention, the component designed as a vibrating mass or part of a vibrating total mass, can, for example, be an inductor, a capacitor, an electrical resistor and/or a transformer. In addition to the at least one component, it is also possible to add yet more masses, such as weights, for example pieces of metal or the like, as a "tuning mass" in order to obtain a specific vibrating total mass, for example to set a desired resonant frequency.

In addition, it is possible, for example, for a conventional tuning mass to be integrated besides the component of the drive circuit, for example for accurate frequency tuning; preferably a metallic material is used for this purpose.

It is preferable for the drive circuit to be constructed as a piezo amplifier for driving piezo elements of the force generator or to have one of this type, an inductor and/or a transformer and/or a capacitor, such as a buffer capacitor, and/or an electrical resistor of the piezo amplifier being constructed as a vibrating mass.

According to a further aspect, the invention provides a force generator for introducing vibrational forces into a structure for vibration control of the structure, having an inertial mass, at least one actuator for generating a vibrating movement of the inertial mass relative to the structure, and an electronic drive circuit constructed from components for driving the at least one actuator, the inertial mass being formed, at least in part, by a component of the drive circuit.

It is preferable for the at least one actuator to be at least one piezoelectric actuator.

It is preferable for the at least one actuator to be a piezo disc actuator.

It is preferable for the at least one actuator to have at least one piezoelectric disc-shaped flexural element or to be formed by such.

It is preferable for the at least one actuator to have at least one piezoelectric disc bender or to be formed by such.

It is preferable for the at least one actuator to have at least one d31 disc bender or to be formed by such.

It is preferable for an inductor of the drive circuit to be used as an inertial mass.

It is preferable for the drive circuit to be constructed as a clocked amplifier, for smoothing an output voltage using an inductor used, at least in part, as an inertial mass, or to have such an amplifier.

It is preferable for at least part of the inertial mass to be a mass of a voltage transformer.

A preferred embodiment of the force generator has a fluid dynamic damper.

It is preferable in order to form the fluid dynamic damper for a housing to be provided in which the inertial mass is arranged so it can move in a vibratory manner between two fluid-filled chamber regions which are in fluid communication with one another.

It is preferable for the fluid connection between the chamber regions to have an adjustable throttle element.

It is preferable for the component of the drive circuit, which acts as the inertial mass, to be connected to the housing by a resilient connection on which the at least one actuator acts.

It is preferable for the two chamber regions to be separated by at least one membrane that is connected to the inertial mass to move therewith and to be in fluid communication with one another by means of a fluid bypass channel.

It is preferable for a first and a second actuator to be constructed and/or arranged symmetrically to the inertial mass.

A preferred embodiment of the invention is constructed as a piezoelectric inertial force generator, in which an inductor, which is part of an electronic drive circuit for driving piezoelectric actuators, is used as an inertial mass. Preferably an inductor of an amplifier, which is used to smooth the output voltage, is used as an inertial mass.

A preferred force generator system is insensitive to lateral acceleration and moisture. Furthermore, it is possible in the case of a preferred embodiment to stop the passive-damping characteristic with simultaneously good heat dissipation.

Normally in the case of piezoelectric inertial force generators to date, a passive mass body, which impairs the mass balance in comparison with electrodynamic systems, has been used as the inertial mass.

To date, a solid body (elastomer) has preferably been selected as the damping material for the defined excessive increases in resonance and is defined in the design phase or construction phase. After assembly, an adjustment of the damping characteristic is no longer possible in the case of inertial-mass force generators known to date.

Further disadvantages of force generators to date are the non-linearity, ageing and temperature rise. A simple cantilever as the spring element is linked in different directions of movement and is thus susceptible to failure with respect to lateral acceleration.

According to a particularly preferred embodiment, the mass of a voltage transformer is used as the inertial mass. The mass of a voltage transformer, which not only smoothes the clocked output voltage of a class D amplifier-audio amplifier-but also generates the necessary high voltage, is particularly suitable as the inertial mass.

Preferably a housing is provided. The housing of the inertial force generator is preferably closed and filled with an inert gas as the fluid. Said housing can be filled with SF6, for example, as the inert gas. The housing preferably has external cavities as the chamber regions, which are connected by a channel in the housing wall. In particular an adjustable valve can act as the throttle element. The adjustable valve in the channel determines the damping and conducts the resultant heat into the housing.

Preferably an even number of piezoelectric d31 disc benders, which are arranged symmetrically relative to the vibrating mass and are thus insensitive to lateral acceleration, can be used to generate force.

Advantages of particularly preferred embodiments of the invention are:
low mass of the actuator/amplifier system,
robust against lateral acceleration,
adjustable damping characteristic,
good heat dissipation of the dissipated energy via the housing wall,
closed system,
the electronic drive circuit can use economical amplifier technology consisting of commercially available audio amplifiers and voltage transformers, and/or
conventional piezoelectric disc benders can be used as actuators.

Figure 2:
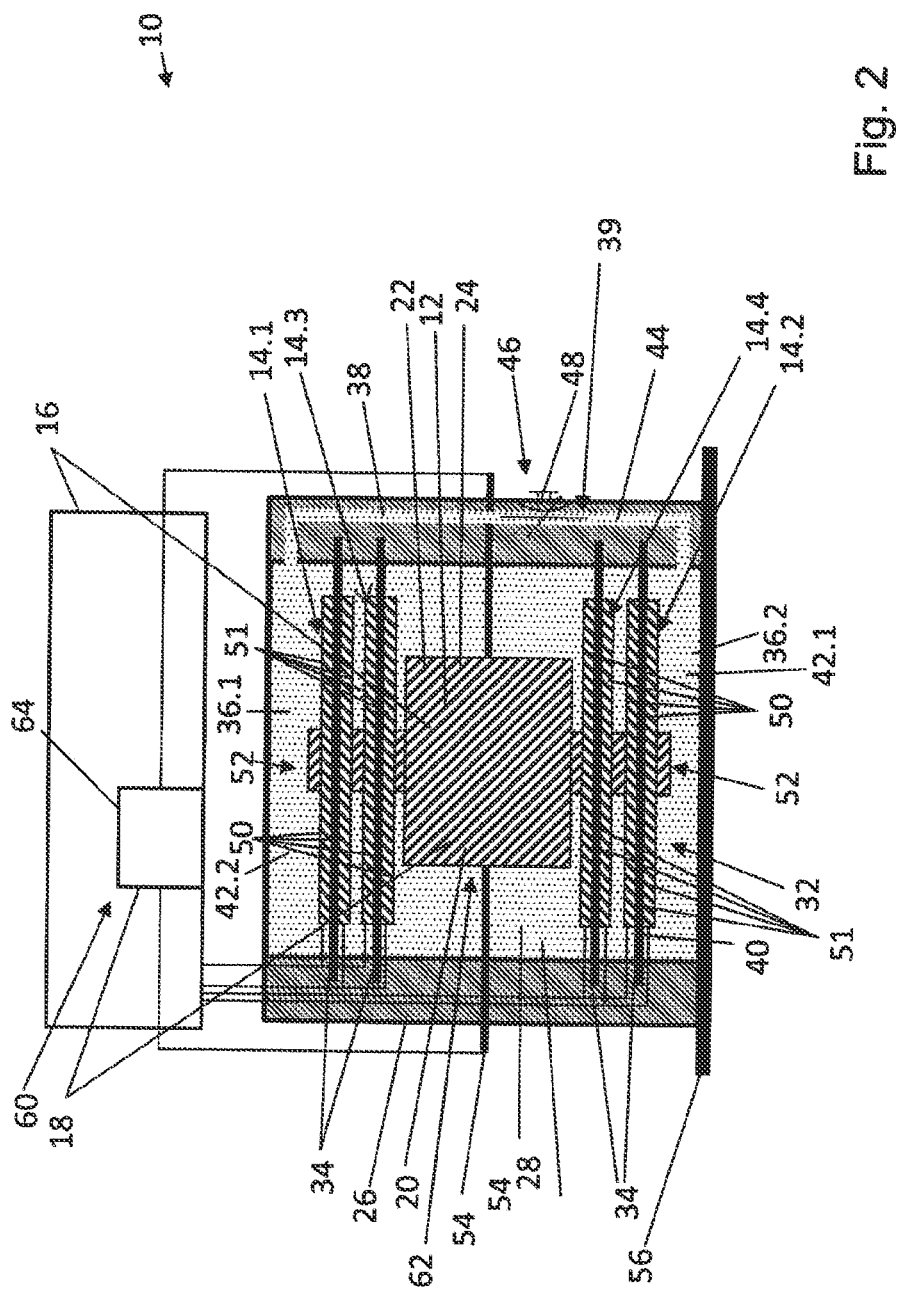
FIG. 2 is a schematic sectional view of a second embodiment of a force generator.

FIGS. 1 and 2 show two embodiments of a force generator 10, which has an inertial mass 12 and at least one actuator 14.1, 14.2, 14.3, 14.4.

Furthermore, an electronic drive circuit 16 for driving the at least one actuator 14.1, 14.2, 14.3, 14.4 is provided. The drive circuit 16, which is shown only as a block view in FIG. 1, can have a structure as described in more detail in EP 2 733 839 A1. The electronic drive circuit 16 has an amplifier 18, which, as an electric or electronic component, has an inductor 22. A block diagram of the amplifier 18 is reproduced in FIG. 4.

In the example shown, a voltage transformer 24, which has at least one coil and one core and is an accordingly heavy mass, is provided as an inductor 22. The mass of the voltage transformer 24, or more generally the inductor 22, is used as the inertial mass 12.

The force generator 10 has a closed housing 26, which is filled with a fluid 28 in the embodiments shown. For example, an inert gas 30, for example SF6, is used as the fluid 28.

In the interior space of the housing 26, an inertial mass actuator 32 formed by the actuators 14.1, 14.2, 14.3, 14.4 and the inertial mass 12 is arranged.

The inertial mass actuator 32 formed by the inertial mass 12 formed by the voltage transformer 24 and the inductor 22 as well as at least one pair 14.1, 14.2 of the actuators and a spring element 34 separates the housing 26 into at least two chamber regions 36.1, 36.2, which are in fluid communication 38 with one another.

The system of chamber regions 36.1, 36.2 having a fluid connection 38 forms a fluid dynamic damper 39 for the force generator 10.

Figure 3:
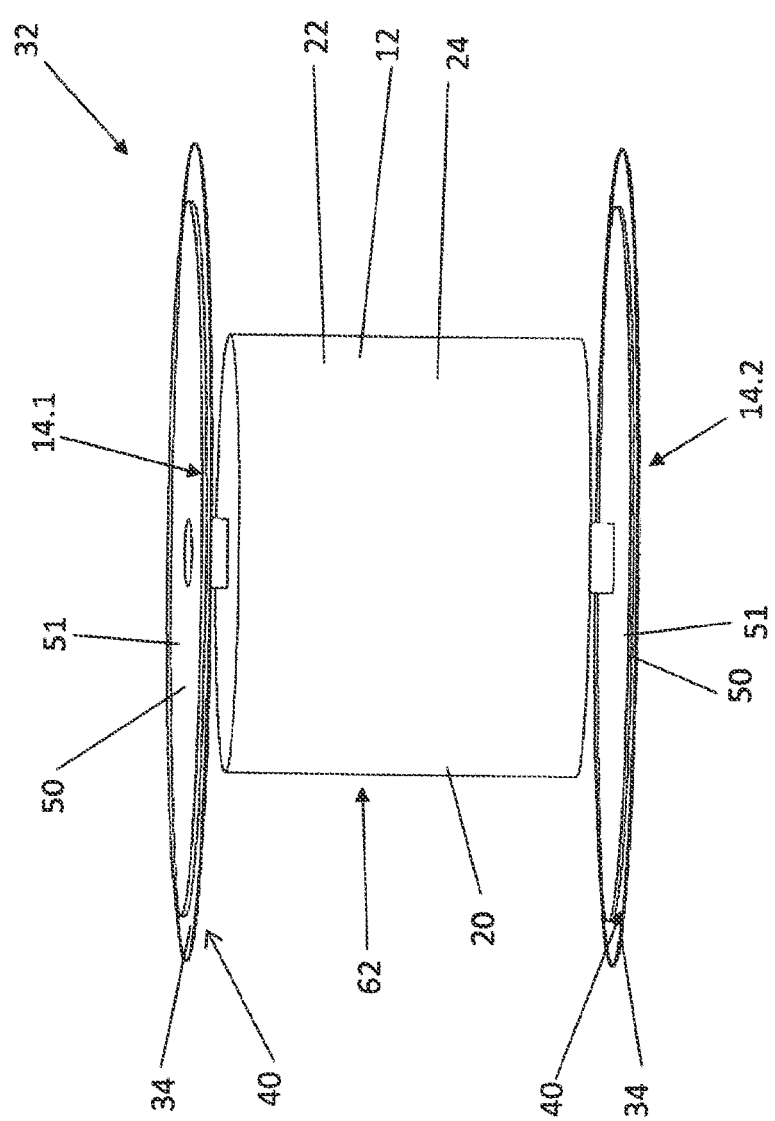
FIG. 3 is a perspective view of a combination of inertial mass and a first and a second piezoelectric actuator, which can be used in the force generators from FIGS. 1 and 2.

As can be seen in particular from FIG. 3, the inertial mass actuator 32 has, for example, at least two membranous spring elements 34, a first actuator 14.1 being assigned to a first spring element 34 and a second actuator 14.2 being assigned to a second spring element 34. The spring elements 34 together with the actuators 14.1, 14.2 each form a separating membrane 40 such that a first and a second outer cavity 42.1, 42.2 are formed as chamber regions 36.1, 36.2.

To form the fluid connection 38, a fluid bypass channel 44, the flow cross section of which is adjustable by a throttle element 46, in particular an adjustable throttle valve 48, is provided between the outer cavities 42.1, 42.2. As a result of this the damping of the fluid dynamic damper 39 is adjustable.

To form the actuators 14.1, 14.2, 14.3, 14.4 an even number of piezo elements 50, in particular of piezoelectric d31 disc benders 51, are used, which are arranged symmetrically to the vibrating inertial mass 12 and connect said vibrating inertial mass to the housing 26 via the spring elements 34.

By driving the actuators 14.1, 14.2, 14.3, 14.4 by means of the electronic drive circuit 16, the actuators are activated in order to move the inertial mass 12 relative to the housing 26 and in particular to cause it to vibrate.

On the opposite side to the inertial mass 12 there can be an end stop 52 on the respective actuators 14.1, 14.2 arranged on the outside and/or on a connection of the same to the inertial mass 12, which limits the amplitude of the displacement by contact with the internal wall of the housing 26.

The inductor 22 acting as the inertial mass 12, in particular the voltage transformer 24, is connected by means of electric lines 54 to the remaining part of the electronic drive circuit 16 arranged outside of the housing 26 and to a voltage source.

In the case of the first embodiment shown in FIG. 1, a first actuator 14.1 and a second actuator 14.2 are provided. The second embodiment shown in FIG. 2 differs from the first embodiment in that a third actuator 14.3 and a fourth actuator 14.4 are used. Apart from this, the second embodiment is equivalent to the first embodiment shown in FIG. 1.

The housing 26 can be part of a structure 56, onto which vibrational forces are to be introduced by the force generator 10 for vibration damping. Alternatively, the housing 26 can be designed to be attached to or arranged on such a structure 56. The structure 56 can, for example, be a mechanical component of an aircraft, in particular a helicopter.

Figure 4:
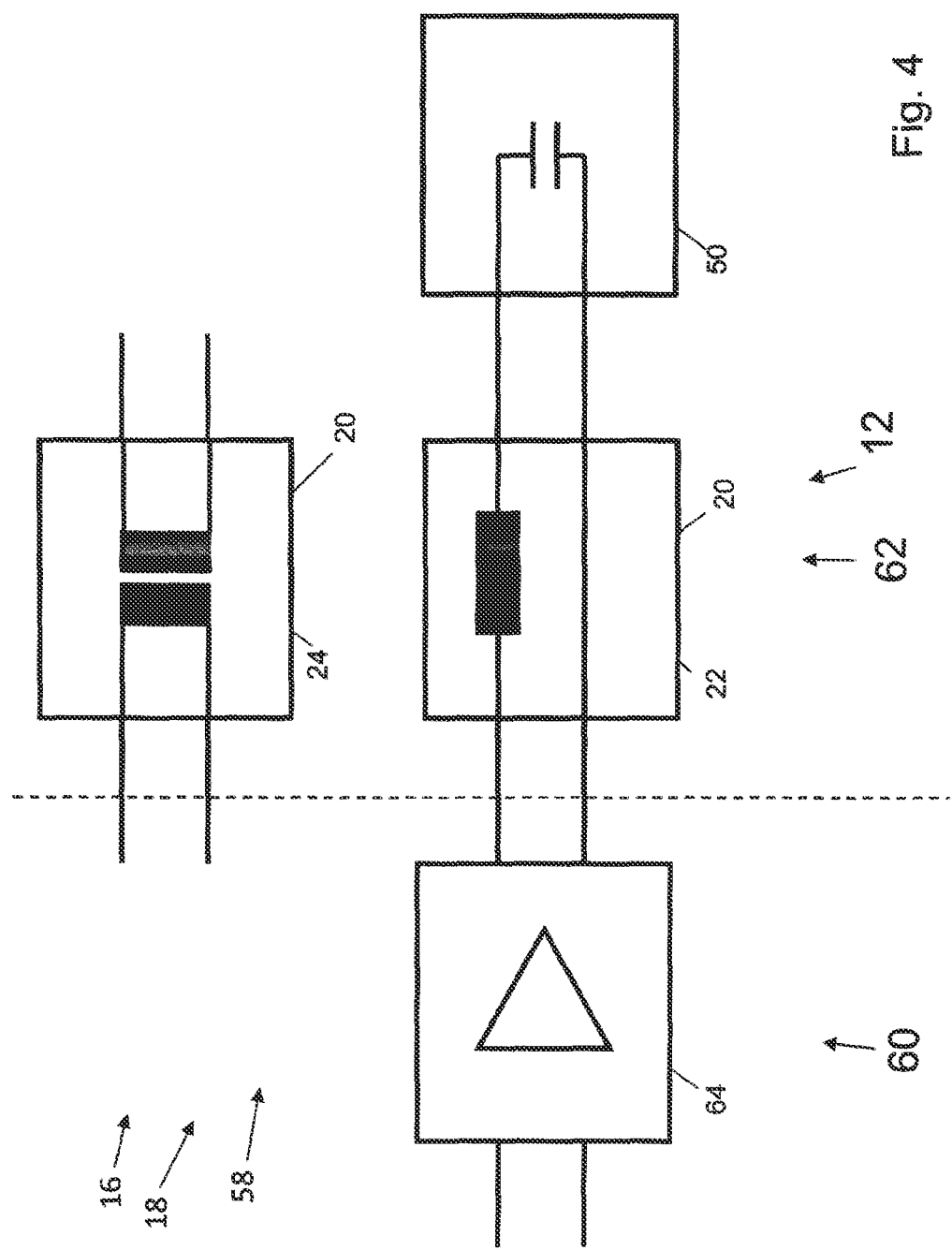
FIG. 4 is a block diagram of an embodiment of an amplifier to be used as a drive circuit or as part of a drive circuit for the force generator.

FIG. 4 is a schematic sketch of the amplifier 18. The amplifier 18 is constructed as a piezo amplifier 58 and has a fixed part 60 and a vibrating part 62. The fixed part 60 has a preamplifier 64. The vibrating part 62 has the inductor 22, which supplies a smoothed voltage to the respective piezo element 50. In the embodiment shown in FIG. 4, the voltage transformer 24 for supplying a supply voltage for the piezo amplifier 58 and/or the whole drive circuit 16 and thus the force generator 10 is accommodated in the vibrating part 62 as well. The inductor 22 can be part of the voltage transformer 24 or an inductive component (for example a coil) fixed thereto. The vibrating part 62 of the amplifier 18 is used as a vibrating mass or an inertial mass 12.

Figure 5:
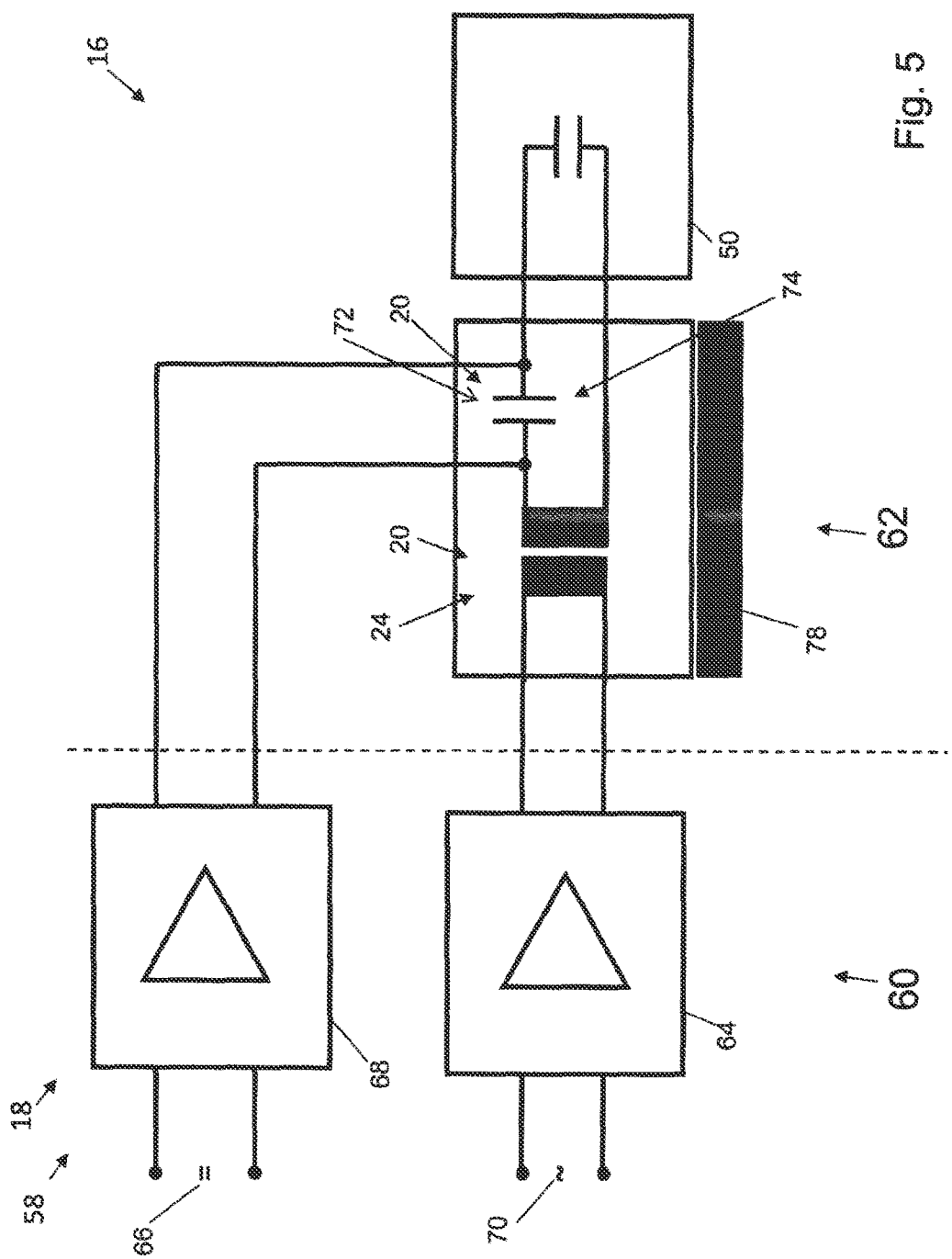
FIG. 5 is a block diagram of a further embodiment of an amplifier to be used as a drive circuit or as part of a drive circuit for the force generator.

FIG. 5 is a schematic sketch of a further embodiment of the amplifier 18, which is likewise constructed as a piezo amplifier 58 for driving the piezo elements 50 and has the fixed part 60 and the vibrating part 62.

In the fixed part 60, a first preamplifier 64 is connected to an alternating voltage 66 and a second preamplifier 68 is connected to a direct voltage 70.

In the vibrating part 62, the voltage transformer 24 and a capacitor 72 in the form of a buffer capacitor 74 are provided as components 20 for forming at least part of the inertial mass 12. The voltage transformer 24 is connected to the first preamplifier 64 and the second preamplifier 68 supplies a direct voltage to the buffer capacitor 74, which is connected in series between the secondary output of the voltage transformer 24 and the input of the piezo element 50 to be driven.

Using this circuit, the piezo element 50 can have an offset voltage applied thereto. For this purpose, a transformer 24 and a buffer capacitor 74 are used as the vibrating mass. For example, the capacity is approximately 10 times greater than that of the piezo element 50. This is an example of the fact that a capacitor 74 or an electrical resistor can also be constructed as a vibrating mass.

It is absolutely possible in all of the embodiments for a conventional tuning mass to be integrated in addition to the at least one component 20 of the drive circuit 16. For example in FIG. 5, it is indicated that for precise adjustment of the frequency an additional mass 78, preferably a weight made from a metallic material, is provided in order to form the inertial mass 12 together with the components 20.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

10 Force generator
12 Inertial mass
14.1 First actuator
14.2 Second actuator
14.3 Third actuator
14.4 Fourth actuator
16 Electronic drive circuit
18 Amplifier
20 Component
22 Inductor
24 Voltage transformer
26 Housing
28 Fluid
30 Inert gas
32 Combination
34 Spring element (resilient connection)
36.1 First chamber region
36.2 Second chamber region
38 Fluid connection
39 Fluid dynamic damper
40 Separating membrane
42.1 First outer cavity
42.2 Second outer cavity
44 Fluid bypass channel
46 Throttle element
48 Adjustable throttle valve
50 Piezo element
51 Disc bender
52 End stop
54 Electric line
56 Structure
58 Piezo amplifier
60 Fixed part (of the amplifier)
62 Vibrating part (of the amplifier)
64 Preamplifier
66 Alternating voltage
68 Preamplifier
70 Direct voltage
72 Capacitor
74 (Buffer) capacitor
78 Additional mass

What is claimed is:

1. A drive circuit for a force generator for introducing vibrational forces into a structure, the drive circuit comprising:
at least one component that is a vibrating mass.

2. The drive circuit of claim 1, wherein the drive circuit includes a piezo amplifier and wherein the vibrating mass includes at least one of an inductor, a transformer, a capacitor, or an electric resistor of the piezo amplifier.

3. A force generator for introducing vibrational forces into a structure for vibration control of the structure, the force generator comprising:
an inertial mass;
at least one actuator configured to generate a vibratory movement of the inertial mass relative to the structure; and
a drive circuit constructed from components and configured to drive the at least one actuator,
wherein at least part of the inertial mass is formed by one component of the drive circuit.

4. The force generator of claim 3, wherein the drive circuit comprises at least one component that is a vibrating mass.

5. The force generator of claim 4, wherein the drive circuit includes a piezo amplifier and wherein the vibrating mass includes at least one of an inductor, a transformer, a capacitor, or an electric resistor of the piezo amplifier.

6. The force generator of claim 3, wherein the at least one actuator is at least one piezoelectric actuator.

7. The force generator of claim 6, wherein the at least one actuator is a piezo disc actuator having at least one of a piezoelectric disc-shaped flexural element or a d31 disc bender.

8. The force generator of claim 3, wherein the inertial mass comprises an inductor of the drive circuit.

9. The force generator of claim 3, wherein the inertial mass comprises an inductor and the drive circuit includes a clocked amplifier configured to smooth an output voltage using the inductor.

10. The force generator of claim 3, wherein at least part of the inertial mass is a mass of a voltage transformer.

11. The force generator of claim 3, further comprising a fluid dynamic damper.

12. The force generator of claim 11, wherein the fluid dynamic damper comprises a housing, the inertial mass being disposed in the housing.

13. The force generator of claim 12, wherein the inertial mass is configured to move in a vibratory manner between two fluid-filled chamber regions of the housing that are in fluid communication with one another through a fluid connection therebetween.

14. The force generator of claim 13, wherein the fluid connection includes an adjustable throttle element.

15. The force generator of claim 12, wherein the inertial mass of the drive circuit is connected to the housing by a resilient connection.

16. The force generator of claim 15, wherein the at least one actuator is configured to act on the component acting as the inertial mass of the drive circuit.

17. The force generator of claim 13, wherein the two fluid-filled chamber regions are separated by at least one membrane connected to the inertial mass and configured to move therewith, and are in fluid communication with one another through a fluid bypass channel.

18. The force generator of claim 3, wherein a first and a second actuator are at least one of formed or arranged symmetrically to the inertial mass.

* * * * *